US006307486B1

(12) United States Patent
Takeda et al.

(10) Patent No.: US 6,307,486 B1
(45) Date of Patent: *Oct. 23, 2001

(54) JOYSTICK DEVICE

(75) Inventors: Genyo Takeda; Junji Takamoto; Kazuo Koshima, all of Kyoto; Masahiko Nakamura; Toshiharu Miyoshi, both of Osaka, all of (JP)

(73) Assignees: Nintendo Co., Ltd., Kyoto; Hoshiden Corporation, Osaka, both of (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/369,388

(22) Filed: Aug. 6, 1999

Related U.S. Application Data

(63) Continuation of application No. 08/860,777, filed as application No. PCT/JP96/03297 on Nov. 8, 1996, now Pat. No. 6,002,351.

(30) Foreign Application Priority Data

Nov. 10, 1995 (JP) .................................................. 7-292617
Nov. 10, 1995 (JP) .................................................. 7-317230

(51) Int. Cl.[7] .......................... H03K 17/94; H03M 11/00

(52) U.S. Cl. ........................ 341/20; 345/161; 74/471 XY

(58) Field of Search .............................. 341/20; 345/161; 74/471 XY; 200/6 R

(56) References Cited

U.S. PATENT DOCUMENTS

| | | |
|---|---|---|
| D. 316,879 | 5/1991 | Shulman et al. . |
| D. 317,946 | 7/1991 | Tse . |
| D. 357,712 | 4/1995 | Wu . |
| D. 363,092 | 10/1995 | Hung . |
| D. 375,326 | 11/1996 | Yokoi et al. . |

(List continued on next page.)

FOREIGN PATENT DOCUMENTS

| | | |
|---|---|---|
| 652209 | 5/1992 | (AU) . |
| 32 04 428 A1 | 8/1983 | (DE) . |
| 40 18 052 | 12/1990 | (DE) . |
| 268 419 | 5/1988 | (EP) . |
| 0 431 723 A2 | 6/1991 | (EP) . |

(List continued on next page.)

OTHER PUBLICATIONS

3D Ballz Instruction Booklet, Accolade, San Jose, California, #3050–00231 Rev. A No Page #.

Knuckles Chaotix Instruction Manual, Sega, Redwood City, California, #84503 (1995) p. 1–29.

Nintendo Power, vol. 30, p. 22, PilotWings article No Date.

Nintendo Power, vol. 31, p. 35, PilotWings article No Date.

Nintendo Power, vol. 31, pp. 74–76, PilotWings article No Date.

(List continued on next page.)

*Primary Examiner*—Timothy Edward, Jr.
(74) *Attorney, Agent, or Firm*—Nixon & Vanderhye P.C.

(57) ABSTRACT

A joystick device includes a case so that first and second rocking members are respectively supported in a overlapped manner by first and second bearings formed in the case with their first and second elongate holes positioned perpendicular to each other. The operation of the lever inserted through the first and second elongate holes causes tilt movement in at least one of the rocking members so that the movement of the rocking member is supplied as a pulse signal by a detecting device. The lever includes an engaging portion engaged with the rocking member on the upper side, and a spherical portion formed at a position above the same rocking member. The cover has a hole having an inner peripheral edge with which contacted is an outer peripheral surface of the spherical portion so that the lever is supported operable in every direction. A spring is provided with the case, which acts to press down the rocking member thereby returning the lever to a neutral position.

3 Claims, 17 Drawing Sheets

U.S. PATENT DOCUMENTS

| | | | |
|---|---|---|---|
| 3,666,900 | 5/1972 | Rothweiler et al. . | |
| 3,729,129 | 4/1973 | Fletcher et al. . | |
| 3,827,313 | 8/1974 | Kiessling . | |
| 4,148,014 | 4/1979 | Burson . | |
| 4,161,726 | 7/1979 | Burson et al. . | |
| 4,315,113 | 2/1982 | Fisher et al. . | |
| 4,359,222 | 11/1982 | Smith, III et al. . | |
| 4,469,330 | 9/1984 | Asher . | |
| 4,485,457 | 11/1984 | Balaska et al. . | |
| 4,538,035 | 8/1985 | Pool . | |
| 4,552,360 | 11/1985 | Bromley et al. . | |
| 4,575,591 | 3/1986 | Lugaresi . | |
| 4,587,510 | 5/1986 | Kim . | |
| 4,620,176 | * 10/1986 | Hayes | 338/128 |
| 4,639,225 | 1/1987 | Washizuka . | |
| 4,659,313 | 4/1987 | Kuster et al. . | |
| 4,685,678 | 8/1987 | Frederiksen . | |
| 4,748,441 | 5/1988 | Brzezinski . | |
| 4,783,812 | 11/1988 | Kaneoka . | |
| 4,789,932 | 12/1988 | Cutler et al. . | |
| 4,799,677 | 1/1989 | Frederiksen . | |
| 4,858,930 | 8/1989 | Sato . | |
| 4,868,780 | 9/1989 | Stern . | |
| 4,875,164 | 10/1989 | Monfort . | |
| 4,887,230 | 12/1989 | Noguchi et al. . | |
| 4,887,966 | 12/1989 | Gellerman . | |
| 4,890,832 | 1/1990 | Komaki . | |
| 4,916,440 | 4/1990 | Faeser et al. . | |
| 4,924,216 | 5/1990 | Leung . | |
| 4,926,372 | 5/1990 | Nakagawa . | |
| 4,933,670 | 6/1990 | Wislocki . | |
| 4,949,298 | 8/1990 | Nakanishi et al. . | |
| 4,974,192 | 11/1990 | Face et al. . | |
| 4,976,429 | 12/1990 | Nagel . | |
| 4,976,435 | 12/1990 | Shatford . | |
| 4,984,193 | 1/1991 | Nakagawa . | |
| 5,001,632 | 3/1991 | Hall-Tipping . | |
| 5,012,230 | 4/1991 | Yasuda . | |
| 5,014,982 | 5/1991 | Okada et al. . | |
| 5,046,739 | 9/1991 | Reichow . | |
| 5,160,918 | 11/1992 | Saponsnik et al. . | |
| 5,203,563 | 4/1993 | Loper, III . | |
| 5,207,426 | 5/1993 | Inoue et al. . | |
| 5,213,327 | 5/1993 | Kitaue . | |
| 5,226,136 | 7/1993 | Nakagawa . | |
| 5,237,311 | 8/1993 | Mailey et al. . | |
| 5,245,320 | 9/1993 | Bouton . | |
| 5,259,626 | 11/1993 | Ho . | |
| 5,273,294 | 12/1993 | Amanai . | |
| 5,276,831 | 1/1994 | Nakanishi et al. . | |
| 5,286,024 | 2/1994 | Winblad . | |
| 5,290,034 | 3/1994 | Hineman . | |
| 5,291,189 | 3/1994 | Otake et al. . | |
| 5,317,714 | 5/1994 | Nakagawa et al. . | |
| 5,327,158 | 7/1994 | Takahashi et al. . | |
| 5,329,276 | 7/1994 | Hirabayashi . | |
| 5,337,069 | 8/1994 | Otake et al. . | |
| 5,357,604 | 10/1994 | San et al. . | |
| 5,358,259 | 10/1994 | Best . | |
| 5,371,512 | 12/1994 | Otake et al. . | |
| 5,388,841 | 2/1995 | San et al. . | |
| 5,388,990 | 2/1995 | Beckman . | |
| 5,390,937 | 2/1995 | Sakaguchi et al. . | |
| 5,393,070 | 2/1995 | Best . | |
| 5,393,071 | 2/1995 | Best . | |
| 5,393,072 | 2/1995 | Best . | |
| 5,393,073 | 2/1995 | Best . | |
| 5,394,168 | 2/1995 | Smith, III et al. . | |
| 5,415,549 | 5/1995 | Logg . | |
| 5,421,590 | 6/1995 | Robbins . | |
| 5,426,763 | 6/1995 | Okada . | |
| 5,436,640 | 7/1995 | Reeves . | |
| 5,437,464 | 8/1995 | Terasima et al. . | |
| 5,451,053 | 9/1995 | Garrido . | |
| 5,453,763 | 9/1995 | Nakagawa et al. . | |
| 5,459,487 | 10/1995 | Bouton . | |
| 5,473,325 | 12/1995 | McAlindon . | |
| 5,512,920 | 4/1996 | Gibson . | |
| 5,513,307 | 4/1996 | Naka et al. . | |
| 5,515,044 | 5/1996 | Glatt . | |
| 5,551,693 | 9/1996 | Goto et al. . | |
| 5,551,701 | 9/1996 | Bouton et al. . | |
| 5,558,329 | 9/1996 | Liu . | |
| 5,563,629 | 10/1996 | Caprara . | |
| 5,566,280 | 10/1996 | Fukui et al. . | |
| 5,577,735 | 11/1996 | Reed et al. . | |
| 5,589,854 | 12/1996 | Tsai . | |
| 5,593,350 | 1/1997 | Bouton et al. . | |
| 5,607,157 | 3/1997 | Nagashima . | |
| 5,615,083 | 3/1997 | Burnett . | |
| 5,624,117 | 4/1997 | Ohkubo et al. . | |
| 5,628,686 | 5/1997 | Svancarek et al. . | |
| 5,632,680 | 5/1997 | Chung . | |
| 5,640,177 | 6/1997 | Hsu . | |
| 5,643,087 | 7/1997 | Marcus et al. . | |
| 5,649,862 | 7/1997 | Sakaguchi et al. . | |
| 5,653,637 | 8/1997 | Tai . | |
| 5,655,411 | * 8/1997 | Avitan et al. | 74/471 XY |
| 5,663,747 | 9/1997 | Shulman . | |
| 5,670,955 | 9/1997 | Thorne, III et al. . | |
| 5,680,534 | 10/1997 | Yamato et al. . | |
| 5,684,512 | 11/1997 | Schoch et al. . | |
| 5,691,898 | 11/1997 | Rosenberg et al. . | |
| 5,704,837 | 1/1998 | Iwasaki et al. . | |
| 5,706,029 | 1/1998 | Tai . | |
| 5,714,981 | 2/1998 | Scott-Jackson et al. . | |
| 5,724,497 | 3/1998 | San et al. . | |
| 5,731,806 | 3/1998 | Harrow et al. . | |
| 5,734,373 | 3/1998 | Rosenberg et al. . | |
| 5,734,376 | 3/1998 | Hsien . | |
| 5,734,807 | 3/1998 | Sumi . | |
| 5,759,100 | 6/1998 | Nakanishi . | |
| 5,769,719 | 6/1998 | Hsu . | |
| 5,784,051 | 7/1998 | Harrow et al. . | |
| 5,785,597 | 7/1998 | Shinohara . | |
| 5,786,807 | 7/1998 | Couch et al. . | |
| 5,791,994 | 8/1998 | Hirano et al. . | |
| 5,793,356 | 8/1998 | Svancarek et al. . | |
| 5,804,781 | 9/1998 | Okabe . | |
| 5,808,591 | 9/1998 | Mantani . | |
| 5,816,921 | 10/1998 | Hosokawa . | |
| 5,820,462 | 10/1998 | Yokoi et al. . | |
| 5,830,066 | 11/1998 | Goden et al. . | |
| 5,838,330 | 11/1998 | Ajima . | |
| 5,850,230 | 12/1998 | San et al. . | |
| 5,862,229 | 1/1999 | Shimizu . | |
| 5,867,051 | 2/1999 | Liu . | |
| 5,877,749 | 3/1999 | Shiga et al. . | |
| 5,880,709 | 3/1999 | Itai et al. . | |
| 5,896,125 | 4/1999 | Niedzwiecki . | |
| 5,898,424 | 4/1999 | Flannery . | |
| 5,946,004 | 8/1999 | Kitamura et al. . | |
| 5,973,704 | 10/1999 | Nishiumi et al. . | |
| 6,001,015 | 12/1999 | Nishiumi et al. . | |
| 6,002,351 | * 12/1999 | Takeda et al. | 341/20 |
| 6,007,428 | 12/1999 | Nishiumi et al. . | |
| 6,017,271 | 1/2000 | Miyamoto et al. . | |
| 6,020,876 | 2/2000 | Rosenberg et al. . | |
| 6,022,274 | 2/2000 | Takeda et al. . | |
| 6,034,669 | 3/2000 | Chiang et al. . | |
| 6,036,495 | 3/2000 | Marcus et al. . | |

| | | |
|---|---|---|
| 6,042,478 | 3/2000 | Ng . |
| 6,050,896 | 4/2000 | Hanado et al. . |
| 6,071,194 | 6/2000 | Sanderson et al. . |
| 6,078,329 | 6/2000 | Umeki et al. . |
| B1 4,870,389 | 6/1997 | Ishiwata et al. . |

FOREIGN PATENT DOCUMENTS

| | | |
|---|---|---|
| 0 470 615 | 2/1992 | (EP) . |
| 553 532 | 8/1993 | (EP) . |
| 685 246 | 12/1995 | (EP) . |
| 724 220 | 7/1996 | (EP) . |
| 2 234 575 A | 2/1991 | (GB) . |
| 2 244 546 | 12/1991 | (GB) . |
| 2 263 802 | 8/1993 | (GB) . |
| 50-22475 | 3/1975 | (JP) . |
| 57-18236 | 1/1982 | (JP) . |
| 57-2084 | 1/1982 | (JP) . |
| 57-136217 | 8/1982 | (JP) . |
| 59-40258 | 3/1984 | (JP) . |
| 59-121500 | 7/1984 | (JP) . |
| 61-16641 | 1/1986 | (JP) . |
| 61-198286 | 9/1986 | (JP) . |
| 61-185138 | 11/1986 | (JP) . |
| 62-269221 | 11/1987 | (JP) . |
| 2-41342 | 3/1990 | (JP) . |
| 2-68404 | 5/1990 | (JP) . |
| 2-283390 | 11/1990 | (JP) . |
| 3-16620 | 1/1991 | (JP) . |
| 3-248215 | 11/1991 | (JP) . |
| 4-26432 | 1/1992 | (JP) . |
| 4-20134 | 2/1992 | (JP) . |
| 4-42029 | 2/1992 | (JP) . |
| 4-104893 | 9/1992 | (JP) . |
| 4-291468 | 10/1992 | (JP) . |
| 5-100759 | 4/1993 | (JP) . |
| 5-19925 | 5/1993 | (JP) . |
| 5-177057 | 7/1993 | (JP) . |
| 5-241502 | 9/1993 | (JP) . |
| 6-23148 | 2/1994 | (JP) . |
| 6-54962 | 3/1994 | (JP) . |
| 6-68238 | 3/1994 | (JP) . |
| 6-110602 | 4/1994 | (JP) . |
| 6-114683 | 4/1994 | (JP) . |
| 6-190145 | 7/1994 | (JP) . |
| 6-190147 | 7/1994 | (JP) . |
| 6-205010 | 7/1994 | (JP) . |
| 6-61390 | 8/1994 | (JP) . |
| 6-285259 | 10/1994 | (JP) . |
| 6-315095 | 11/1994 | (JP) . |
| 07068052 | 3/1995 | (JP) . |
| 07088252 | 4/1995 | (JP) . |
| 7-104930 | 4/1995 | (JP) . |
| 7-144069 | 6/1995 | (JP) . |
| 7-222865 | 8/1995 | (JP) . |
| 7-288006 | 10/1995 | (JP) . |
| 7-317230 | 12/1995 | (JP) . |
| 8-45392 | 2/1996 | (JP) . |
| 9-56927 | 3/1997 | (JP) . |
| 92/09347 | 6/1992 | (WO) . |
| 94/12999 | 6/1994 | (WO) . |
| 97/17651 | 5/1997 | (WO) . |
| WO97/32641 | 12/1997 | (WO) . |

OTHER PUBLICATIONS

Nintendo Power, vol. 38, p. 25, PilotWings article No Date.

Nintendo Power, vol. 46, PilotWings article. No Date, No Page #.

PilotWings Instruction Booklet, Super Nintendo Entertainment System, SNS–PW–USA, copyright 1991 pg. 1–18.

PilotWings, It's a Festival of Flight, Top Secret Password Nintendo Player's Guide, pp. 82–83 and 160, 1991.

PilotWings, Soar with the Flight Club, Super Nintendo Entertainment System Play's Guide, pp. 100–105, 1991.

SEGA Genesis 32X Instruction Manual, SEGA, Redwood City California, #672–2116 (1994) No Page#.

Sonic 2 The Hedgehog Instruction Manual, SEGA, Hayward, California, #672–0944 3701–925–0–01 (1992) pg. 1–24.

Sony PlayStation Instruction Manual, and information materials, Sony Computer Entertainment Inc. 1995 No. pg.

*IBM Technical Disclosure Bulletin*, vol. 37, No. 08, Aug. 1994, pp. 73–74, "Analog Joystick Interface Emulation using a Digital Counter".

*IBM Technical Disclosure Bulletin*, vol. 33, No. 11, Apr. 1991, pp. 105–106, "Hardware Reset With Microcode Warning Period".

Super Mario 64 Player's Guide, Nintendo of America, 1996. pg. 1–92.

Nintendo Power, "The Fun Machine" for Nintendo 64, 1996.

Nintendo Power, vol.80, pp. 20–27, Jan. 1996.

*Nintendo Employee Shosinkai Reports*, 14 pages, Nov. 24–26, 1995.

Sega Force/Saturn Tech Specs, Data Information, 1997. pg. 1–5.

Sega Force/Saturn Peripherals, Data Information,1997–99. pg. 1–4.

* cited by examiner

JOYSTICK DEVICE

This is a continuation of application Ser. No. 08/860,777, filed Jul. 9, 1997, (now U.S. Pat. No. 6,002,351), the entire content of which is hereby incorporated by reference in this application which is a 371 of PCT/JP96/03297 filed Nov. 8, 1996.

BACKGROUND OF THE INVENTION

PRIOR ART

One example of a joystick device is described for example in Japanese Provisional Utility Model Publication No. H2-68404. This conventional art joystick device has a pair of rocking members, each having an elongate hole arranged such that these elongate holes are placed perpendicular to each other. A lever is inserted through the respective elongate holes of the pair of the rocking members so that the lever is allowed to tilt in every direction about a predetermined point as a fulcrum point. The lever is projected to extend from a predetermined location of a cover attached to a case for accommodating the rocking members therein.

In the above conventional art, the lever has a lower portion inserted through an elongate hole of one rocking member to be attached to the same rocking member through a shaft extending perpendicular to a lengthwise direction of the elongate hole, thereby preventing the lever from being removed off and rotating about its own axis. Consequently, the fulcrum point of the lever is located on the shaft at which the lever at its lower portion is attached to the rocking member. To this end, there is a necessity of providing a relatively large opening in the cover in order to obtain a sufficient range of tilt movement of the lever.

However, if a large opening is formed in a cover, there often encounters a case that dust or dirt intrudes into an interior of the case through the opening, impairing operational reliability in rotational or sliding portions of the joystick device.

SUMMARY OF THE INVENTION

It is therefore a primary object of the present invention to provide a joystick device which is capable of positively preventing the lever from removed off and rotating about its own axis, and positively preventing against intrusion of dust and dirt into the interior of the case.

It is another object of the present invention to provide a joystick device in which the lever can automatically be returned to a neutral position without fail.

It is another object of the present invention to provide a joystick device in which an electric signal is provided with accuracy responsive to the position and the angle of tilt of the lever.

The present invention lies in a joystick device comprising: a case (14, 22); first and second bearing portions (30*a*, 30*b*, 32*a*, 32*b*) formed in the case to have respective axes extending perpendicular to each other; a first rocking member (40) having first support shafts (46*a*, 46*b*) supported by the first bearings (30*a*, 30*b*), and a first elongate hole (44) that is long in an axial direction of the first support shaft; a second rocking member (42) having second support shafts (56*a*, 56*b*) supported by the second bearing portions (32*a*, 32*b*), and a second elongate hole (54) that is long in an axial direction of the second support shaft, the first rocking member and the second rocking member being arranged in such an overlapped state that the first elongate hole and the second elongate hole extend perpendicular to each other; a lever (64) inserted through the first elongate hole and the second elongate hole, the lever when operated causing rocking movement in at least one of the first rocking member and the second rocking member, the lever including an engaging portion (66) in engagement with one of the first rocking member and the second rocking member and a spherical portion (68) formed at a position thereof above the second rocking member; a detecting means (34, 36, 74, 76) for detecting rocking movement in at least one of the first rocking member and the second rocking member to output an electric signal; a cover (18) attached to the case and having a hole (88) defined by an inner peripheral edge that contacts with an outer peripheral surface of the spherical portion, the hole holding the spherical portion so that the lever can be operated in every direction; and a spring (84, 128, 130) provided within the case so as to return the lever to a neutral position.

That is, in the present invention the lever inserted through the elongate holes of the pair of rocking members has the projection that is latched to either one of the rocking members so as to prevent the lever from being removed off. The lever is projected through the hole provided in the cover. The lever is provided with the spherical portion supported in contact with the edge of the hole for tilt movement about the contact point as a fulcrum point in every direction.

Therefore, according to the present invention, there is no necessity of providing a large-sized opening for obtaining a range of tilt movement of the lever. Furthermore, since the spherical portion of the lever is in contact with the edge of the hole on, the cover side, the location at which the lever projects out of the cover is closed. This eliminates the possibility that dust or dirt intrudes therethrough which might impair operational reliability in rotational or sliding portions of the lever.

Also, the lever at the spherical portion thereof is supported by the contact point as a fulcrum point for tilt movement thereabout in every direction. A rotation-preventive means is provided at the contact point between the spherical portion and the inner peripheral edge of the hole, to prevent the lever from rotating about an axis thereof. Moreover, the projection of the lever is structurally latched to the rocking member, preventing against removal off and about-own-axis rotation of the lever.

In one aspect of the present invention, a rotation-preventive mechanism is provided, for preventing the lever from rotating its own axis, at a position of contact between the spherical portion and the edge of the hole in the cover. In this aspect, the projection of the lever is latched to the pair of the rocking members supported through support shafts by the bearing portions, thereby preventing the lever from being removed off. Also, the rotation-preventive mechanism prevents the lever from being rotated about its own axis. This rotation-preventive mechanism is provided at the contact point between the spherical portion of the lever and the hole edge on the case side, so that there is no necessity of providing, at a location of the case the lever extends, such an opening that induces intrusion of dust or dirt therethrough.

The rotation-preventive means may adopt a detailed structure that includes a groove formed in the spherical portion to extend in a parallel direction of the lever, and a hub formed projecting from the inner peripheral edge of the hole to be slideable fitted in the groove in a manner contacted with groove walls and a groove bottom thereof. If such a structure is employed for the rotation-preventive mechanism, the portion at which the lever extends from the cover is completely closed such that the surface of the spherical portion of the lever is in contact with the edge of the hole on the cover side and the groove walls and the groove bottom of the groove are in contact with the hub on the cover side, thereby eliminating a gap of intruding even dust and dirt.

Also, it is possible to adopt such a structure that the case is separated as an inner case provided with two sets of bearings and an outer case for accommodating this inner case so that a cover is mounted on the outer case. In such a case, the inner case and the rocking members can be accommodated within a space enclosed by the outer case and the cover, eliminating intrusion of dust or dirt.

Furthermore, it is possible to adopt such a structure that has a circular hole provided at a central portion of the cover so that the wall surrounding the hole has a gradient descending toward the hole, flat surfaces formed at respective end portions of the one pair of rocking members such that they are involved in a same horizontal plane when the lever is in a neutral state, and the spring is accommodated within a space defined around the taper wall so as to be interposed between the cover and the respective flat surfaces. In such a case, a press-down member is preferably disposed between a lower end of the spring and the respective flat surfaces of the one pair rocking members to have a surface thereof placed in horizontal when the lever is in the neutral state, so that the surface of the press-down member and the respective flat surfaces of the one pair rocking members are overlapped by surface contact with each other.

In this aspect, since the space around the cover taper wall is effectively utilized as a space for accommodating the spring, there becomes no necessity of separately providing a spring accommodation space between the cover and the case, correspondingly promoting miniaturization. The force of the spring is evenly applied through the press-down member to the respective flat surfaces of the one pair rocking members, thereby improving reliability of return of the lever to the neutral position.

In the present invention, the displacement of a displacing member is detected by a 2-phase 2-channel detecting element so that it is possible to obtain an electric signal with accuracy in dependence upon a tilt state of the lever.

The above described objects and other objects, features, aspects and advantages of the present invention will become more apparent from the following detailed description of the present invention when taken in conjunction with the accompanying drawings.

EMBODIMENTS

Figure 1:
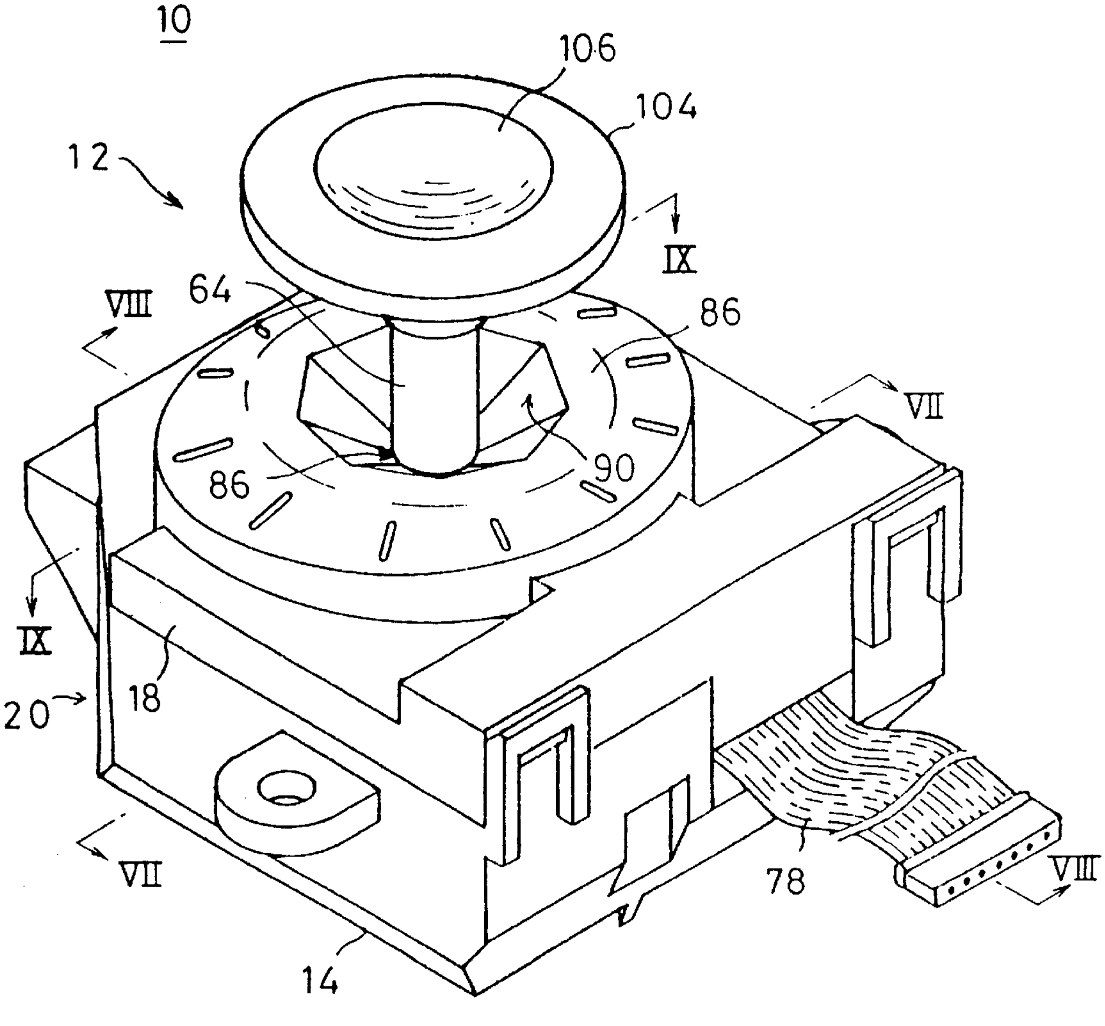
FIG. 1 is a perspective view showing an analog joystick as one embodiment of the present invention.

Referring to FIG. 1, an analog joystick 10 as, one embodiment of the present invention includes a joystick unit 12. The joystick unit 12 includes a housing 20 formed by an outer case 14 and a cover 18, so that an inner case 22 (FIG. 2) is accommodated within the outer case 14 or the housing 20.

Figure 2:
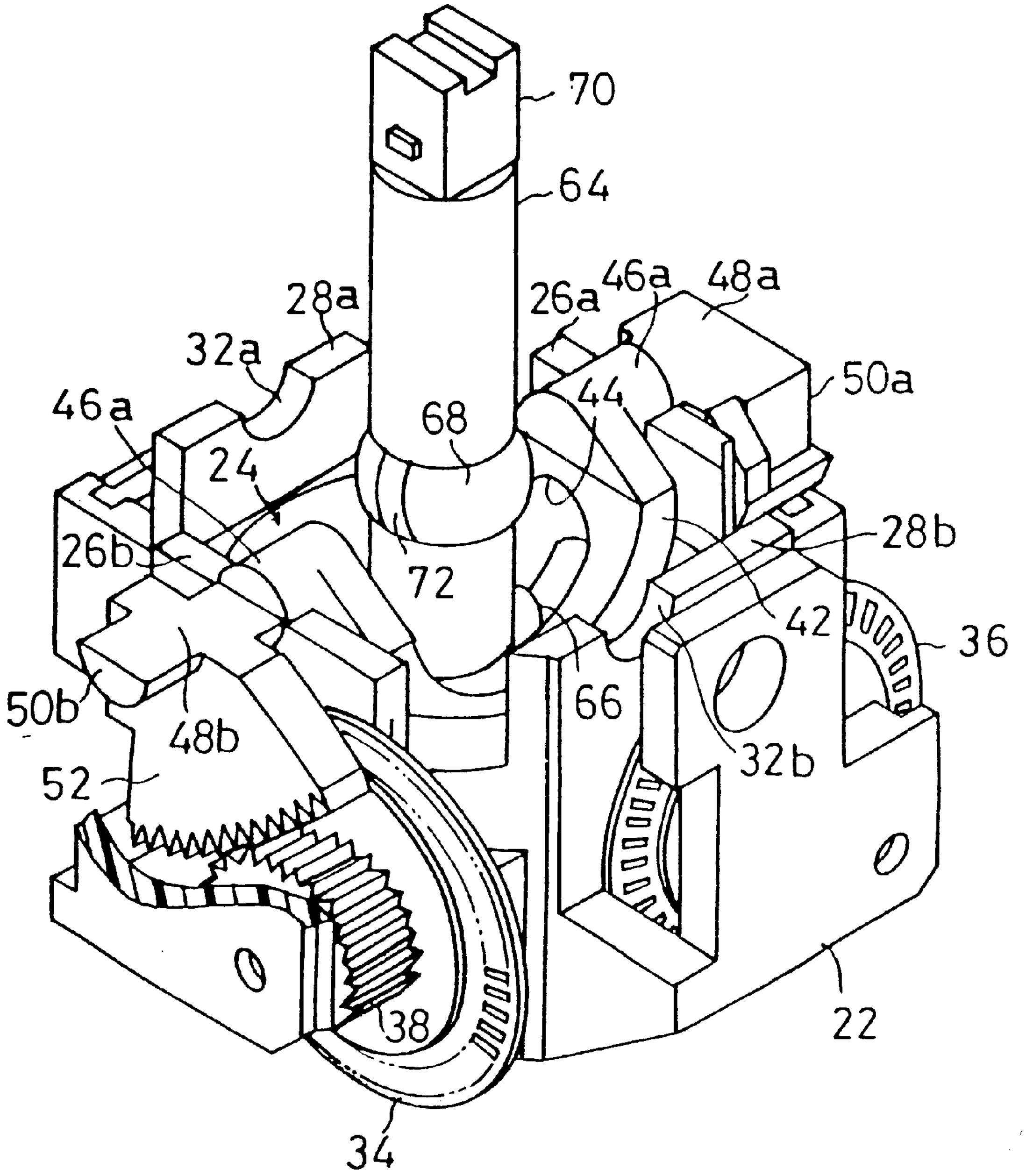
FIG. 2 is a perspective view showing, by partly omitting, an interior structure of FIG. 1 embodiment.
Figure 3:
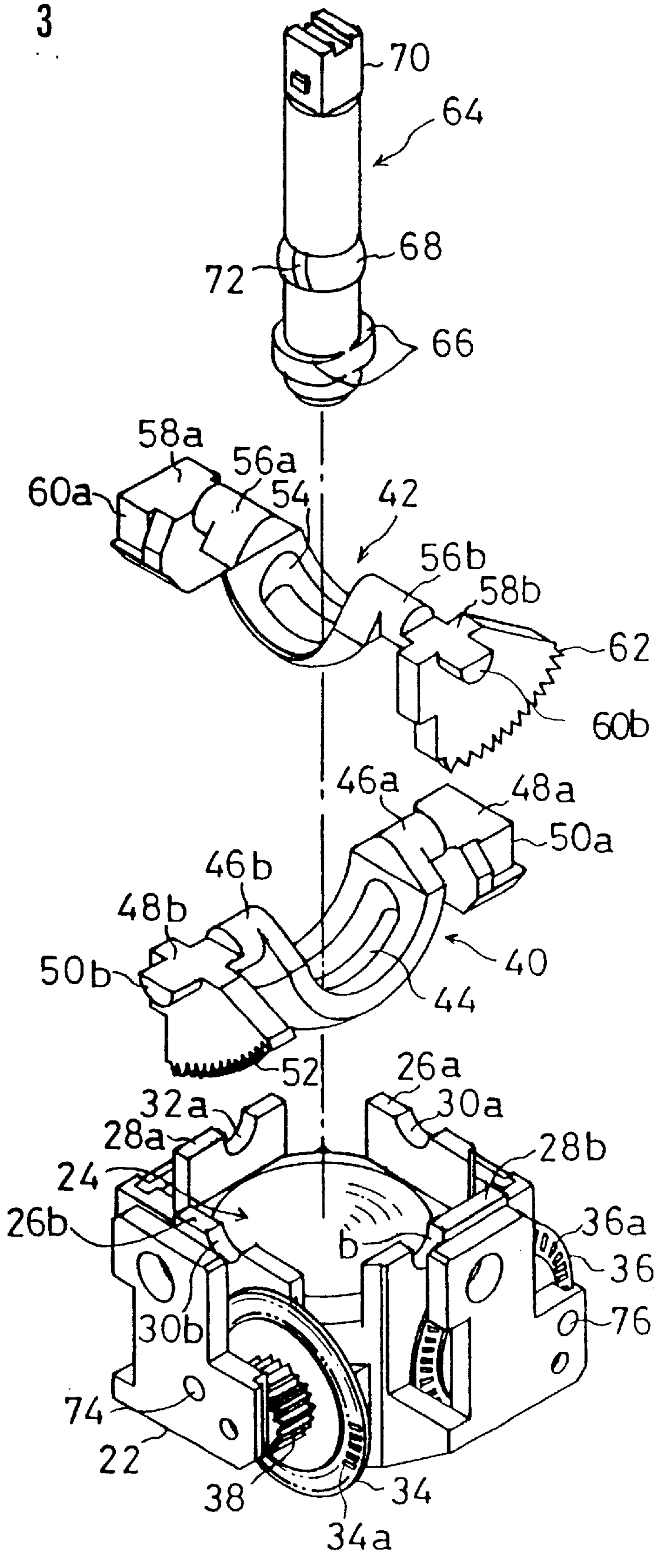
FIG. 3 is an exploded perspective view showing an inner case, rocking members and a lever of FIG. 1 embodiment.

As shown in FIG. 2 and FIG. 3, the inner case 22 has a recessed portion 24 formed in a bowl form at a central portion thereof. In a manner of surrounding the recessed portion 24, two pairs of support plates **26*a* and 26*b*, and 28*a* and 28*b* are provided spaced at an angular interval of 90 degrees from one another so that semicircular bearings 30*a* and 30*b*, and 32*a* and 32*b* are respectively provided in these support plates 26*a* and 26*b*, and 28*a* and 28*b*. The bearings 30*a* and 30*b* or 32*a* and 32*b* are disposed on a same axial line so that the bearings 30*a* and 30*b*, and 32*a* and 32*b* have their respective axes that intersect perpendicular to each other at a same height level. The inner case 22 has blades or disks 34 and 36 rotatably supported on respective side surfaces thereof in a manner such that their rotational axes are perpendicular to each other. Similarly, the disk 36** is provided with a gear (not shown).

The joystick unit 12 further includes rocking members 40 and 42. One rocking member 40 is formed by an arcrate member having an elongate hole 44 formed long in a lengthwise direction to have support shafts **46*a* and 46*b* at respective ends. From these support shafts 46*a* and 46*b* are extended shaft end portions 50*a* and 50*b* respectively having flat surfaces 48*a* and 48*b*. The shaft end portion 50*b* on one side is provided with a fan-shape gear 52. The other rocking member 42 is different from the one rocking member 40 in that it is formed by an accurate member smaller in radius of curvature than that of the one rocking member 40, but is similar in structure in other respects. That is, reference numeral 54 designates an elongate hole, reference numerals 56*a* and 56*b* are support shafts, reference numeral 58*a* and 58*b* are flat surfaces, reference numerals 60*a* and 60*b* are shaft end portions, and reference numeral 62** is a gear.

Figure 6:
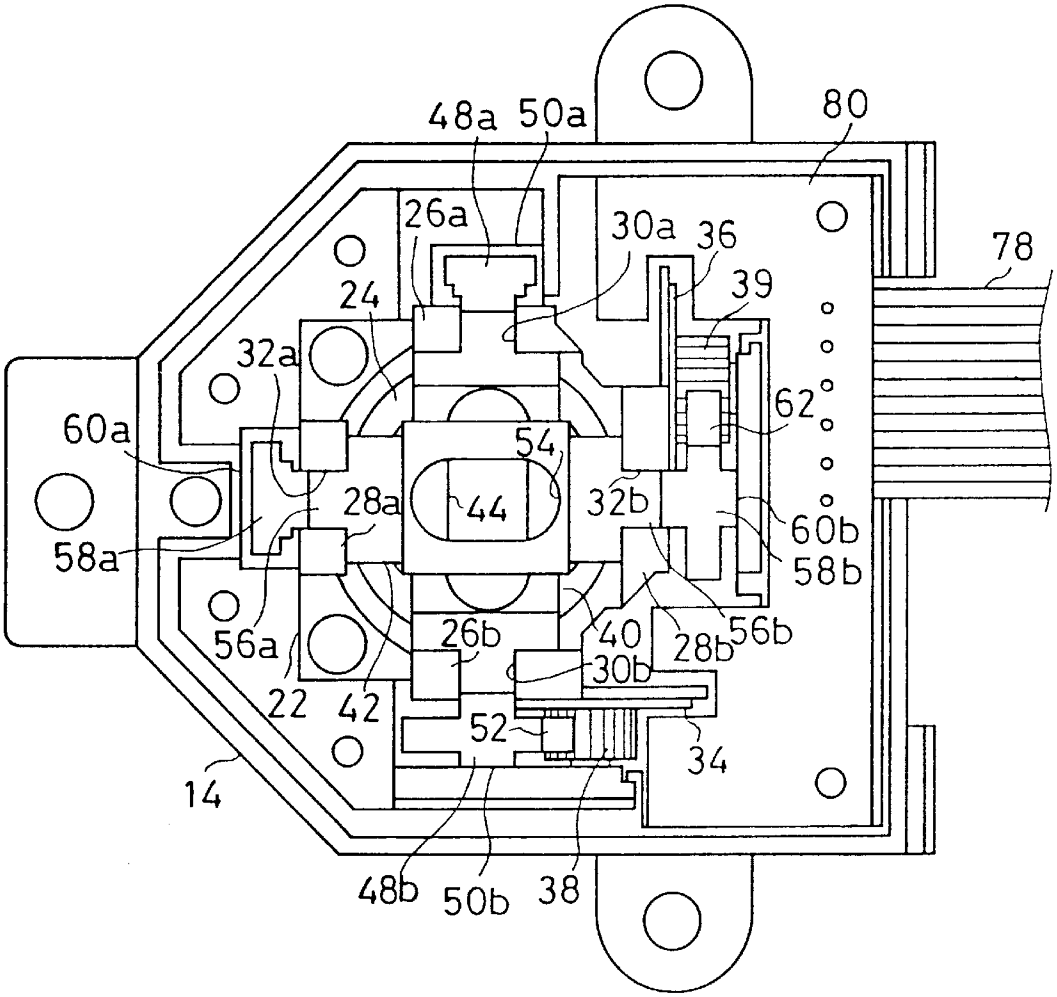
FIG. 6 is a plan view showing, by omitting the cover and the lever, FIG. 1 embodiment.
Figure 8:
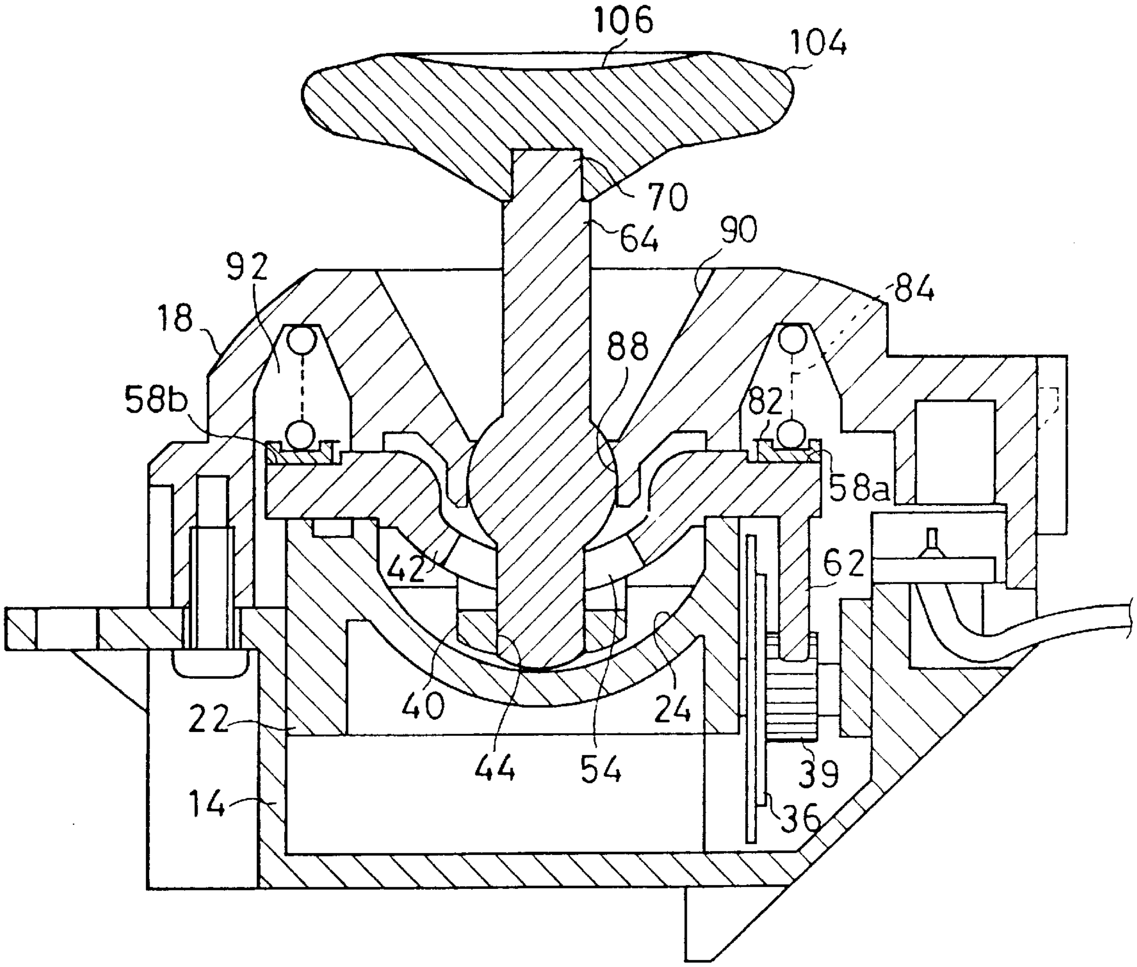
FIG. 8 is a sectional view taken on line VIII—VIII in FIG. 1.

The pair of rocking members 40 and 42 are received at their support shaft **46*a* and 46*b*, and 56*a* and 56*b* by respective two sets of bearings 30*a* and 30*b*, and 32*a* and 32*b*, to be supported for rocking movement. These rocking members are arranged overlapped by being spaced at a given interval with their elongate holes positioned rectangular in lengthwise direction to each other. In this manner, the fan-shape gear 52 of the one rocking member 40 attached to the inner case 22 is in mesh with the above-stated gear 38. Similarly, the fan-shape gear 62 of the other rocking member 42 is in mesh with the gear 39 (FIG. 6 and FIG. 8). The above-mentioned flat surfaces 48***a* and 48*b* and 58*a* and 58*b* are in a same horizontal plane when the lever 64 is in a neutral state, as stated later.

As shown in FIG. 3, the lever 64 has a projection 66 formed radially outwardly projecting at one end portion thereof, a spherical portion 68 formed at an intermediate portion, and an connecting portion 70 formed at the other end portion. The spherical portion 68 has grooves 72 formed extending in parallel direction at locations distant by 180 degrees. The diameter of the lever 64 is determined not grater than the shorter diameter of the elongate holes 44 and 54 of the rocking members 40 and 42, preferably to such a dimension that the lever is slideable received through the elongate holes 44 and 54 without chattering. The lever 64 at the one end is inserted through the elongate hole 44 and 54 with the projection 66 thereof engaged with the elongate hole 44 of the lower rocking member 40. Consequently, the projection 66 of the lever 64 projects in a direction perpendicular to the lengthwise direction of the elongate hole 54 of the upper rocking member 42 attached to the inner case 22. This prevents the lever 64 from being removed off by the abutment of the projection 66 against the upper rocking member 42 when the lever 64 is upwardly pulled.

The mechanism assembly constructed as shown in FIG. 2 is placed within the outer case 14 shown in FIG. 1. In this case, the inner case 22 is fixed to the outer case 14 by using an appropriate means such as screws, not shown.

The inner case 22 has, as will be clearly understood from FIG. 3, photointerrupters 74 and 76 provided in a manner opposite to the respective two blades or disks 34 and 36. The photointerruplers 74 and 76 each include light emitting elements and light receiving elements (not shown) so that the light emitted from the light emitting element passes through the slits 34*a* and 36*a* formed in the blade or disk 34 and 36 to be received by the light receiving element. Consequently, the photointerrupters 74 and 76 detect the slits 34*a* and 36*a* to output a pulse signal in response to the slits 34*a* and 36*a* by the rotation of the blade or disk 34 and 36.

Incidentally, the height level of the axis (the support shafts 46 and 56) of tilt movement of the rocking members 40 and 42 is in coincident with the height level of the center of the spherical portion 68 of the lever 64.

Figure 4:
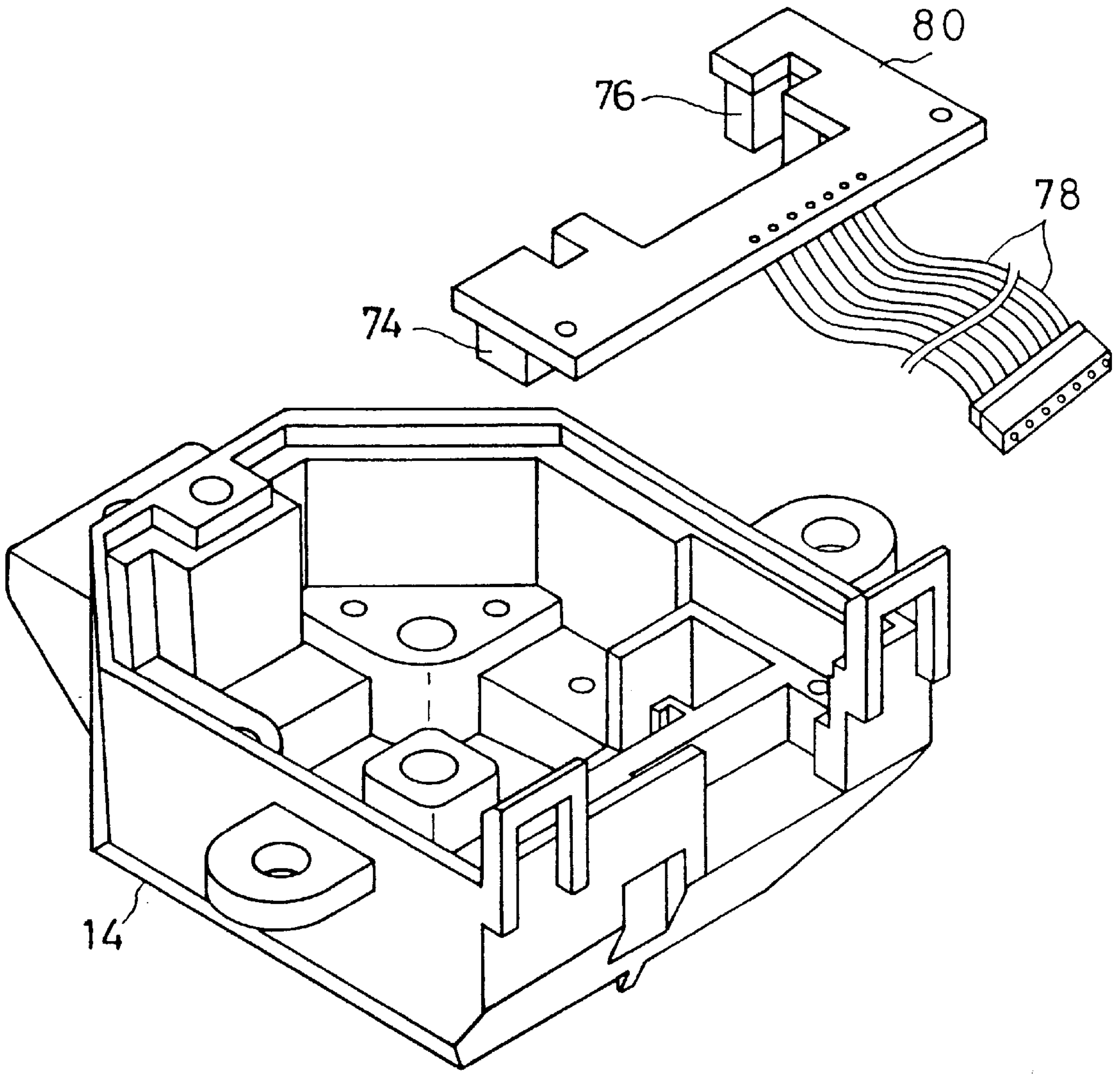
FIG. 4 is an exploded perspective view showing an outer case, a circuit board, etc., of FIG. 1 embodiment.

The outer case 14 incorporates therein a circuit board 80 connected with a flexible circuit 78 as shown in FIG. 4, wherein this circuit board 80 has an interconnection pattern to which electrically connected are the light emitting elements and the light receiving elements included in the photointerrupters 74 and 76.

Figure 5:
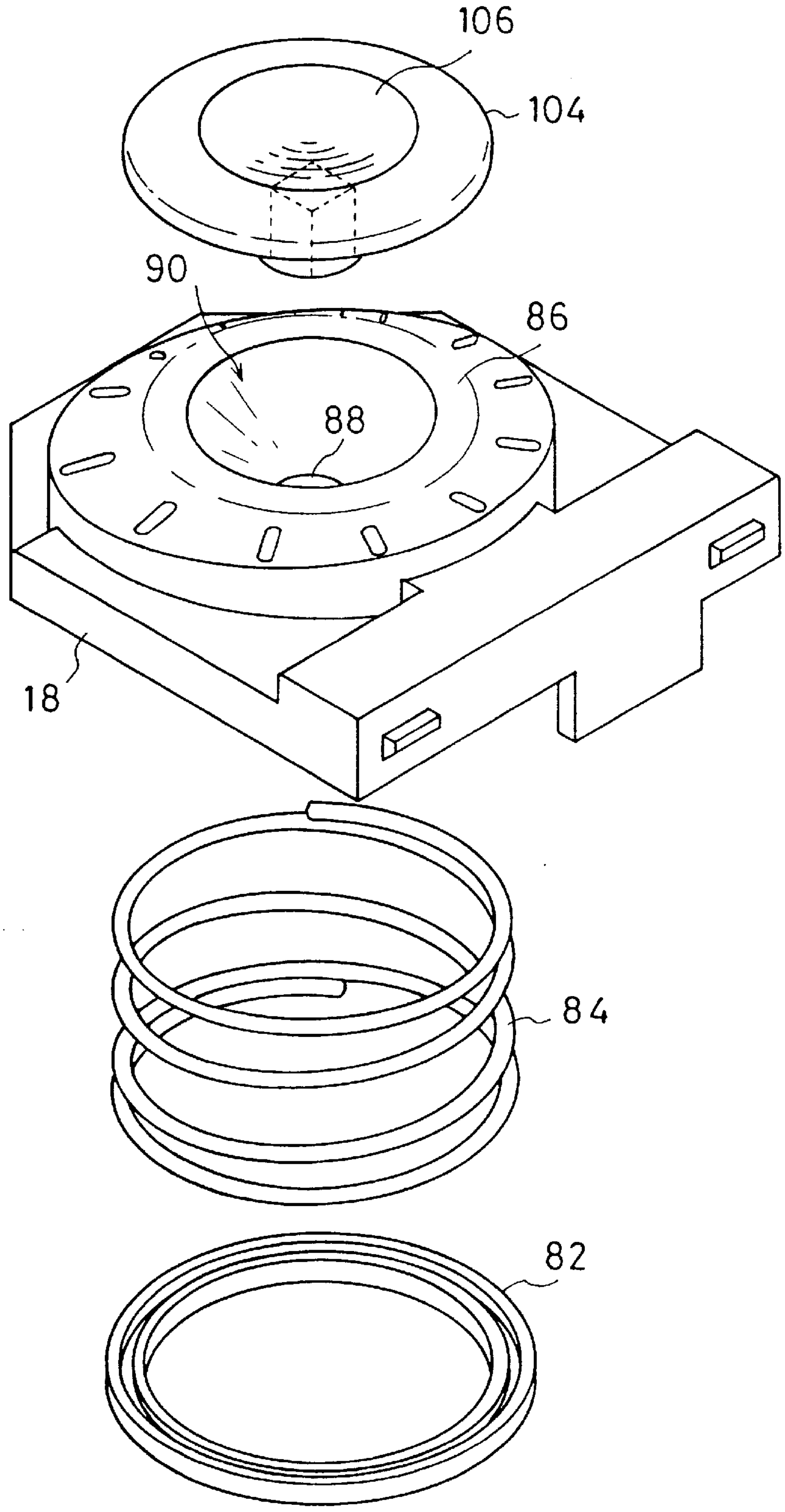
FIG. 5 is an exploded perspective view showing a grooved ring, a spring, a cover, etc. of FIG. 1 embodiment.
Figure 7:
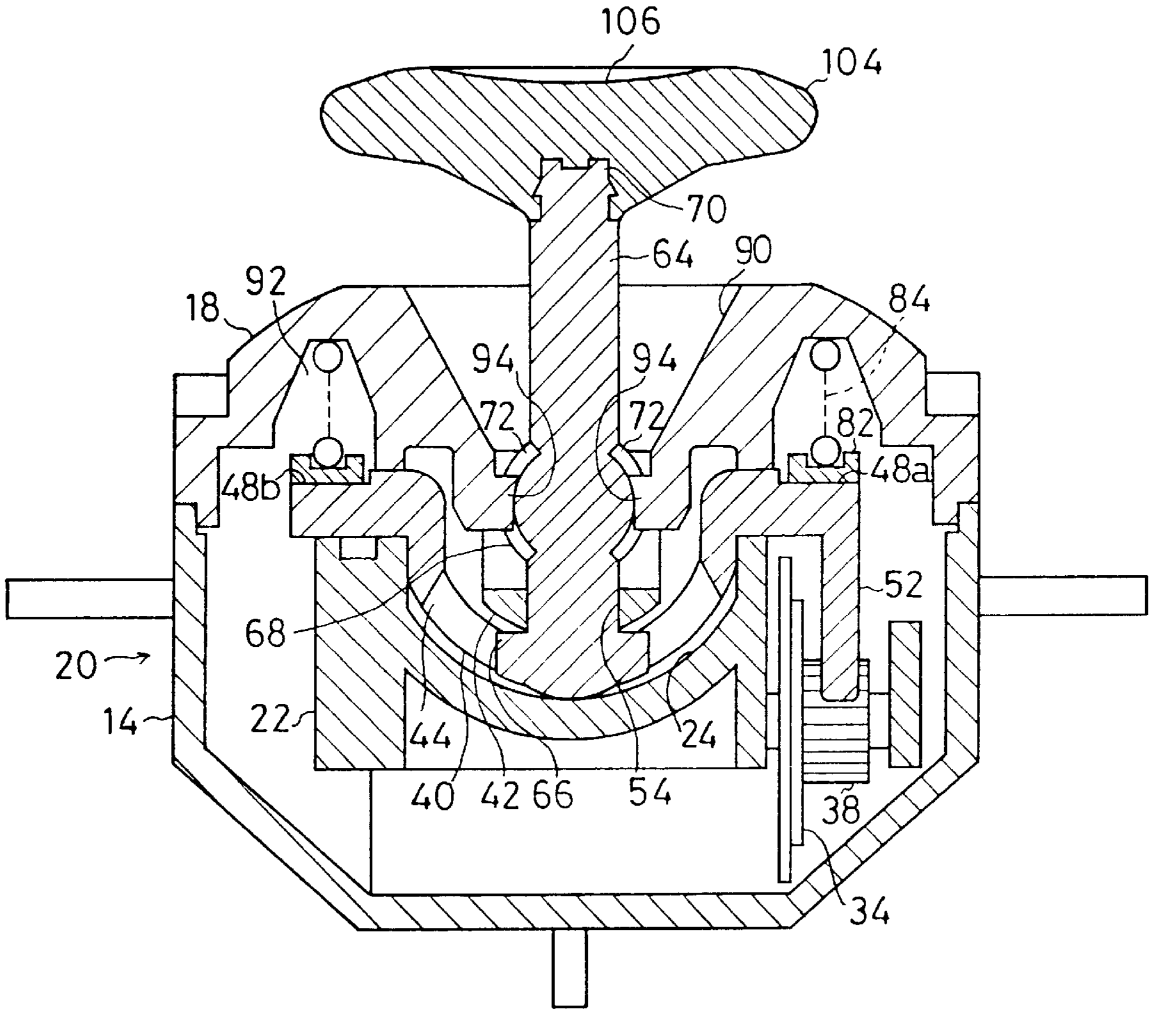
FIG. 7 is a sectional view taken on line VII—VII in FIG. 1.

As will be understood from FIG. 5, FIG. 7 and FIG. 8, a grooved ring 82 is rested on the flat surfaces 48 and 58 formed in the pair of rocking members 40 and 42, and a coil spring 84 is disposed on the grooved ring 82. The grooved ring 82 is an example of a press-down member, which in a lever 64 neutral state becomes horizontal at its underside surface so that the underside surface of the ring 82 overlies the flat surfaces 48 and 58 in surface contact therewith.

As shown in FIG. 1 and FIG. 5, the cover 18 has a guide ring 86 mounted thereon, which ring 86 is formed at a central portion with a circular hole 88. The guide ring 86 further includes a guide wall 90 that rises in gradient from an periphery of the hole 88 toward the outward. That is, the guide wall 90 is formed as a whole in a "cone" form. The guide wall 90 has an outer edge in a circular form as shown in FIG. 5 or an octagonal form as shown in FIG. 1, as viewed from the above.

Here, as shown in FIG. 7 and FIG. 8, the spring 84 is accommodated around the guide wall 90 within a space 92 so that it is interposed between the cover 18 and the flat surfaces 48 and 58 through the grooved ring 82. As a result, the space 92 around the guide wall 90 in the cover 18 is effectively utilized as an accommodation space for the spring 84 without left in uselessness.

Figure 9:
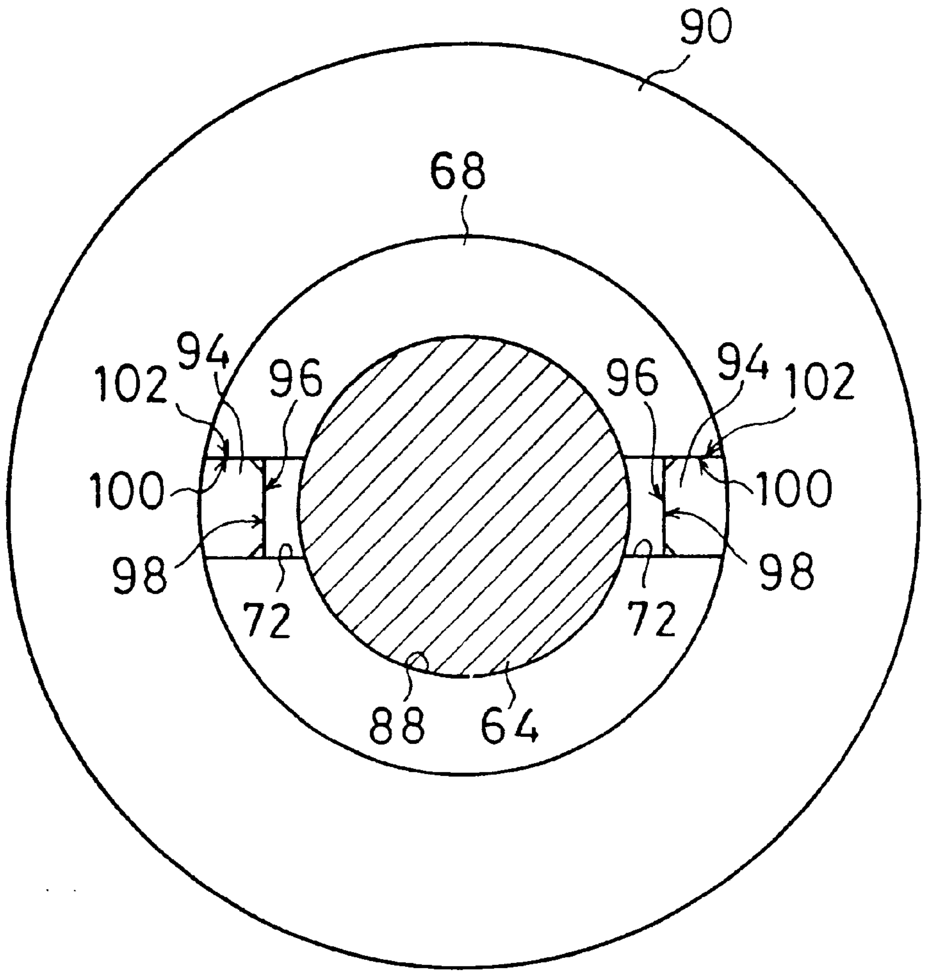
FIG. 9 is a segmentary sectional view taken on line IX—IX in FIG. 1.

Incidentally, the diameter of the hole 88 of the guide ring 86 is determined in almost the same dimension as the diameter of the outer periphery of the spherical portion 68. Consequently, the hole 88 is in contact at its edge with the spherical portion 68 of the lever 64 so that the lever 64 is supported by the spherical portion 68 and the hole 88 for tilt movement in every direction, as shown in FIG. 8. As shown in FIG. 7, the hole 88 of the guide ring 86 has circular hubs 94 formed projecting radially inward at two locations spaced by 180 degrees so that these hubs 94 are respectively fitted in the parallel grooves 72 of in the spherical portion 68. These hubs 94 have an axis thereof coincident with the axis of tilt movement in the rocking members 40 and 42. As will be understood from FIG. 9, the hub 94 has an tip end 96 in slidable contact with an accurate groove bottom 98 in the groove 72 with outer peripheral surfaces 100 thereof slideable contacted with groove walls 102 in the groove 72.

If the parallel groove 74 in the spherical portion 68 is received by the hub 94 formed in the cover 18 in a state as above, the lever 64 is allowed to move about the axis of the hubs 94, but cannot be rotated about an axis of the lever 64 itself. Therefore, the grooves 72 of the spherical portion 68 and the hubs 94 constitute a rotation-preventive mechanism that serves to prevent the lever 64 from rotating about its own axis.

Also, in the state that the cover 18 is fitted over the outer case 14, the spring 84 is in compression by being sandwiched between the grooved ring 82 and the cover 18. As a result, the flat surfaces 48 and 58 of the pair of the rocking members 40 and 42 are depressed at all times by the force of the spring 84 via the grooved ring 82. This depressing action elastically urges at all times the pair of rocking members 40 and 42 in a manner not to incline in any direction. As a result, the lever 64 is held in an uprightly standing position or a neutral state at all times by the elastically urging force.

A manipulation knob 104 is attached onto the lever 64 through a connecting portion 70 thereof, as shown in FIG. 1 and FIG. 5 The manipulation knob 104 has a top surface formed with a recessed portion 106 for resting fingers thereon.

As stated above, the spherical portion 68 of the lever 64 is in contact with the edge of the hole 88 on the cover 18 side, and the grooves 72 in the spherical portion 68 are respectively received by the hubs 94 of the cover 18 so that the hub 94 is always in contact with the groove bottom 98 and the groove walls 102. Therefore, there exists no gap between the lever 64 projecting from the hole 88 and the cover 18. Consequently, no dust or dirt intrudes into the interior of the housing 20 (FIG. 1) maintaining the initial reliability of rotational and sliding portions of the joystick unit 12 over a long period of term.

In the analog joystick 10 constructed as above, the rocking member 40 and/or 42 is rocking-moved in dependence upon the direction and the angle of tilt of the lever 64. If the blade or disk 34 and/or 36 is rotated depending upon the angle of movement in the rocking member 40 and/or 42, pulses are outputted by the photointerrupters 74 and 76 in accordance with the amount of rotation of the disk 34 and/or 36. The pulses are utilized as a coordinate signal for a direction of an X-axis and/or a Y-axis.

Figure 10:
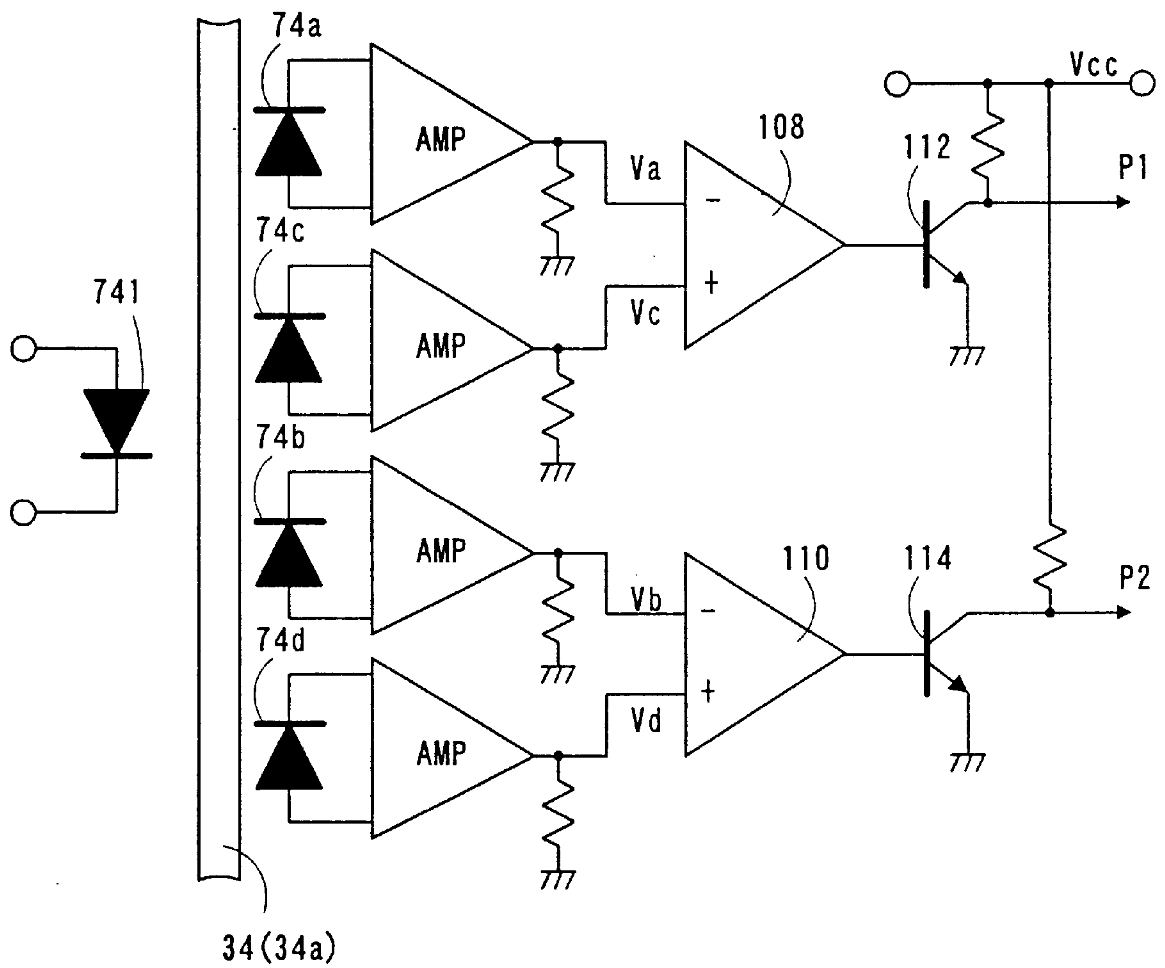
FIG. 10 is a circuit diagram showing a pulse generating circuit of FIG. 1 embodiment.

Here, explanation will be made on the generation of pulses by the disks 34 and 36 and the photointerrupters 74 and 76, with reference to FIG. 10 to FIG. 12. Note that the below explanation will be principally on interaction between the one disk 34 and the photointerrupter 74. The interaction between the other disk 36 and the photointerrupter 76 is similar to this, the explanation thereof being omitted.

As stated above, the slits 34*a* are formed at a predetermined pitch in an outer periphery of the disk 34 so that the slit 34*a* is detected by the photointerrupter 74. The photointerrupter 74 includes, as shown in FIG. 10, one light emitting element 741 and four light receiving elements 74*a*, 74*b*, 74*c* and 74*d* for receiving the light from the light emitting element 741. The disk 34, i.e., the slits 34*a*, is interposed between the light emitting element 741 and the light receiving elements 74*a*, 74*b*, 74*c* and 74*d*. The light receiving elements 74*a*–74*d* are of a 2channel 2phase photodiode. The respective outputs of the first light receiving element 74*a* and the third light receiving element 74*c* are inputted through an amplifier to an operational amplifier 108 as shown in FIG. 10, while the respective outputs of the second light receiving element 74*b* and the fourth light receiving element 74*d* are inputted through an amplifier to an operational amplifier 110. That is, the light receiving elements 74*a*–74*d* each have an electric current in an amount commensurate with the intensity of the light from the light emitting element 741. This electric current is converted by a resistance connected to an output of the amplifier so that the terminal voltage of the resistance is inputted as an output voltage of the light receiving element 74*a*–74*d* to the amplifier 108 or 110. The operational amplifiers 108 and 110 each output electric voltage in an magnitude commensurate with the difference in two input voltages so that the output voltages are respectively converted by waveform shaping circuits formed by transistors 112 and 114 into pulse signals P1 and P2.

Figure 11:
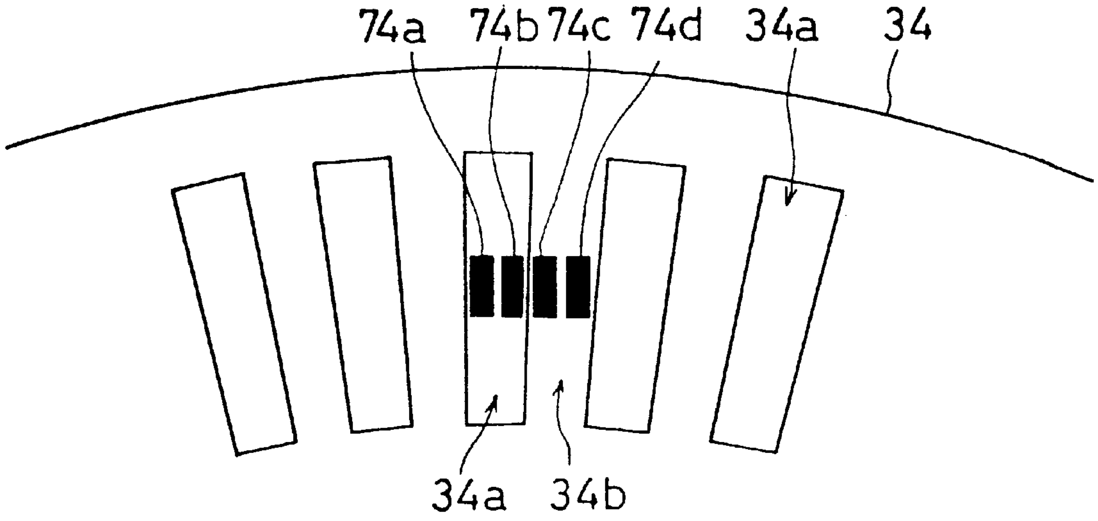
FIG. 11 is an illustrative view showing the relationship between slits and light receiving elements of FIG. 1 embodiment.
Figure 12:
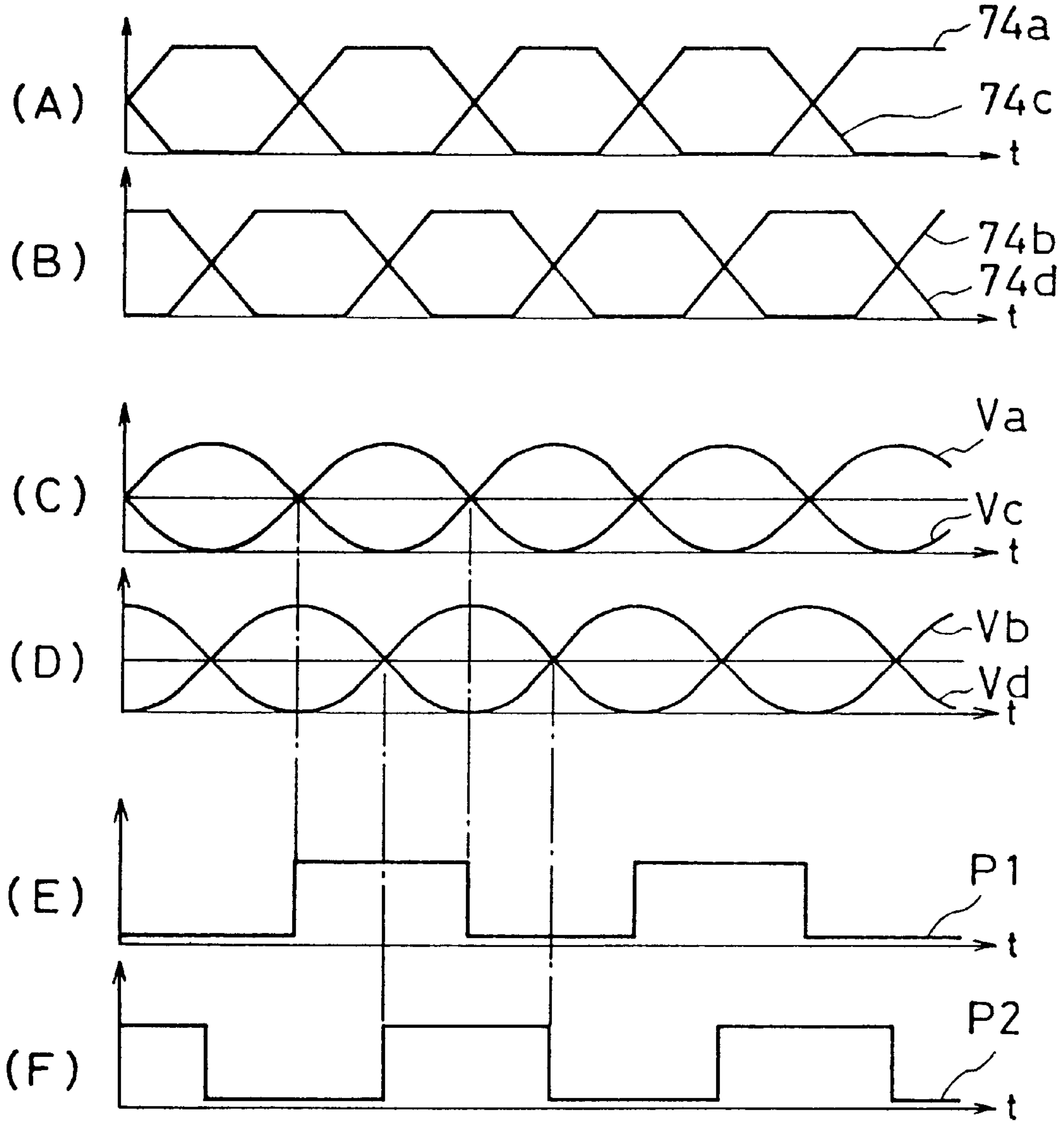
FIG. 12 are waveform diagrams showing pulse signals generated by FIG. 10 circuit.

As shown in FIG. 11, the pitch of the light receiving elements 74*a*–74*d* and the pitch of the slits 34*a* in the first disks 34 are set in a relationship as stated below. That is, when adjacent two light receiving elements 74*a* and 74*b* come to a slit 34*a*, the remaining two light receiving elements 74*c* and 74*d* are in a shadow 34*b* between slits 34*a*. Conversely, when the light receiving elements 74*c* and 74*d* go to a slit 34*a*, the light receiving elements 74*a* and 74*b* are in a shadow 34*b* between slits 34*a*. That is, the light receiving element 74*a* and the light receiving element 74*c* have a phase difference of 180 degrees, while the light receiving element 74*b* and the light receiving element 74*de* have a phase difference of 180 degrees. Consequently, as the disk 34 rotates, the area of light reception by the light receiving element 74*a* and 74*c* varies as shown in FIG. 12(B).

Therefore, the operational amplifier 108 receives two input voltages Va and Vc different in phase by 180 degrees, as shown in FIG. 12(C), while the operational amplifier 110 receives two input voltages Vb and Vd different in phase by 180 degrees, as shown in FIG. 12(D). The voltage Vc is applied to a (+) input of the operational amplifier 108, and the voltage Va is to a (–) input thereof. Therefore, when the voltage Va is in a positive polarity, the difference between the voltage Va and the voltage Vc becomes great, whereas when the voltage Va is in a negative polarity, the difference between the voltage Va and the voltage Vc becomes small. To this end, when the voltage Va is in a negative polarity, the operational amplifier 108 has a decreased output voltage to turn off the transistor 112. When the voltage Va is in a positive polarity, the output voltage of the operational amplifier 108 increases to turn on the transistor 112. Therefore, the transistor 112 outputs at a corrector thereof a pulse signal P1 as shown in FIG. 12(E), depending upon the rotation of the disk 34. Similarly, when the voltage Vd is in a negative polarity the output voltage of the operational amplifier 110 decreases to turn off the transistor 114, whereas when the voltage Vd is in a positive polarity the output voltage of the operational amplifier 110 increases to turn on a transistor 114. Therefore, the transistor 114 outputs at a corrector a pulse signal P2 as shown in FIG. 12(F), in dependence upon the rotation of the disk 34.

In this manner, there is a difference in phase by 90 degrees between the pulse signal P1 and the pulse signal P2 as shown in FIG. 12(E) and FIG. 12(F). It is therefore, possible to determine a direction of rotation of the disk 34 by judging which one of the pulse signal P1 and the pulse signal P2 is earlier to be outputted.

In the above analog joystick 10, if the lever 64 held in a neutral state by the force of the spring 84 (FIG. 5, FIG. 7 and FIG. 8) is operated at a manipulation knob by fingers, it is tilt-moved about the axis of the hubs 94 against the force of the spring 84. It is assumed that this direction of tilt movement is a “forward-backward direction”. When the lever 64 is being moved about the axis of the hubs 94 to an arbitrary position, the spherical portion 68 can be rotated in the parallel direction along the hubs 94 as a guide that are fitted in the grooves 72. Accordingly, it is possible to move the lever 64 in a “left-right direction” with respect to the above “forward-backward direction”. Therefore, the lever 64 is allowed to tilt-move about the spherical portion 68 as a center in every direction.

If the lever 64 is moved in an arbitrary direction and then the manipulation knob 104 of the lever 64 is released from the fingers, the force of the spring is transmitted to the lever 64 via the pair of rocking members 40 and 42 thereby returning the lever 64 to the neutral state. In this case, the force of the spring 84 is evenly applied to the flat surfaces 48 and 58 (FIG. 7 and FIG. 8) of the pair of the rocking members 40 and 42 through the grooved ring 82, thereby improving reliability in return of the lever 64 to the neutral state.

When the lever 64 is moved in an arbitrary direction, the pair of the rocking members 40 and 42 are respectively moved by an amount commensurate with the amount of rocking movement thereof in the forward-backward direction and the left-right direction. In accordance with the angle of movement in the rocking members 40 and 42, the disks 34 and 36 are rotated so that pulse signals are outputted in response to the rotational amount.

Although in the above embodiment the outer case 14 and the inner case 22 were employed, the inner case 22 may be omitted by providing bearing portions 30 and 32 in the outer case 14, or providing photointerrupters 74 and 76 to the outer case 14.

Also, in the above embodiment, the structure that the pair of rocking members 40 and 42 are depressed at their flat surfaces 48 and 58 by the force of the spring 84 through the grooved ring 82 was employed as a means for elastically urging at all times the lever 64 toward the neutral state. However, other structure may be adopted as a means for elastically urging the lever 64 always toward the neutral state.

Figure 13:
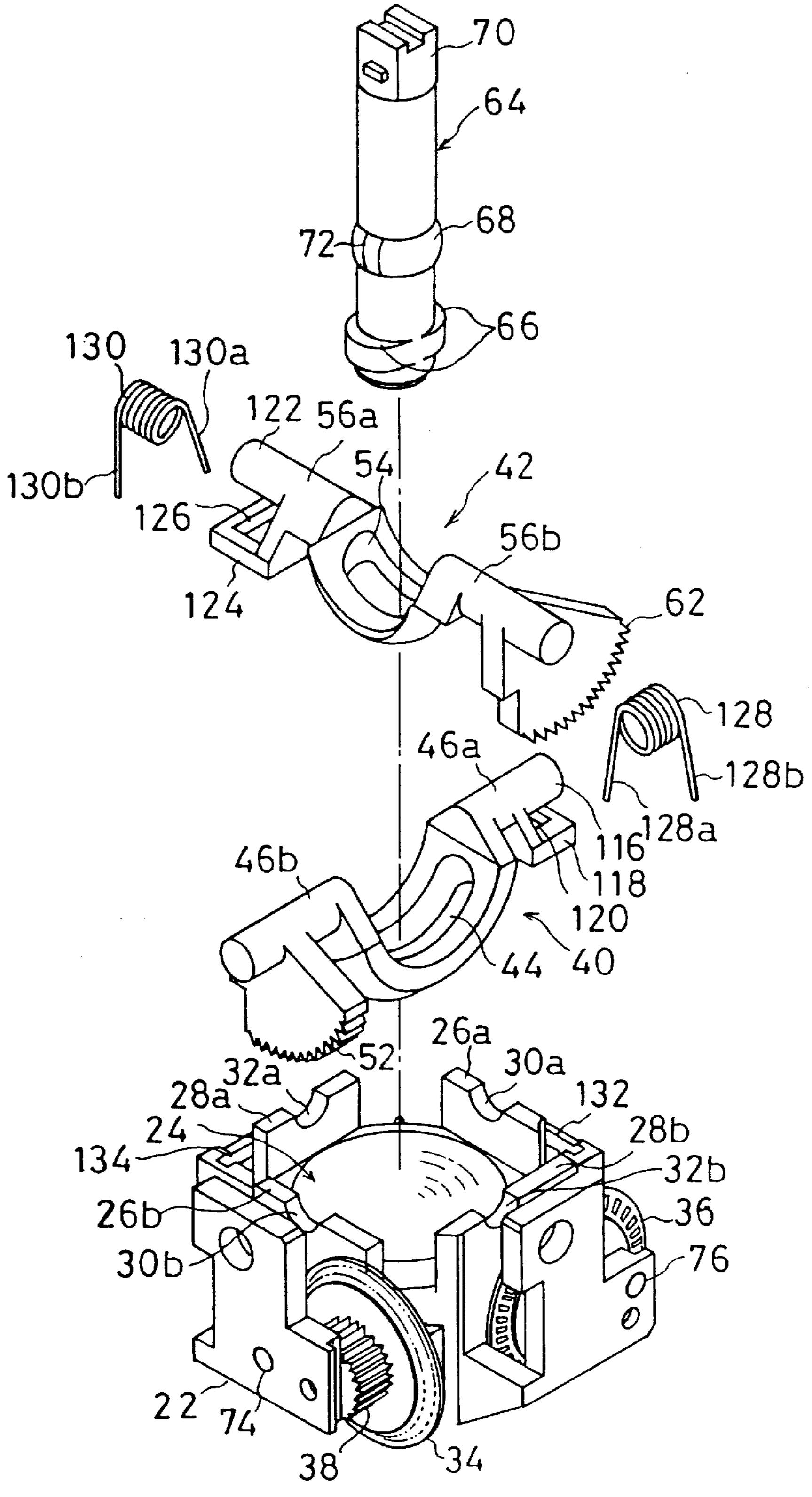
FIG. 13 is an exploded perspective view showing another embodiment of the present invention.

Referring to FIG. 13, another embodiment of the present invention is shown, which is similar to the above embodiment excepting the points given below. In the figure, the same and corresponding parts or elements are denoted by the same reference numerals, thereby omitting explanations thereof.

Of the rocking members 40 and 42, one rocking member 40 has a support shaft 46*a* on one side extending in an axial direction to have a protuberance 118 provided opposite to the extended shaft portion 116 in a manner integral therewith. The protuberance 118 has an opening 120 formed therethrough. The other rocking member 42 also has a support shaft 56*a* on one side extending in one axial direction to have a protuberance 124 integrally provided with an extended shaft portion 122 in a manner opposite thereto. The protuberance 124 is provided with an opening 126.

Torsion coil springs 128 and 130 each have a pair of leg portions 128*a* and 128*b*, 130*a* and 130*b* at respective ends. One torsion coil spring 128 is fitted over the extended shaft portion 116 of the one rocking member 40 so that the leg portions 128*a* and 128*b* are passed through the opening 124 of the protuberance 122 to be received in the recess portion 132 of the inner case 22. These leg portions are supported by elastic abutment against the opposite wall surfaces 132*a* and 132*b* (see FIG. 14) in the recess portion 132. Similarly, the other torsion coil spring 130 is fitted over the extended shaft portion 122 of the other rocking member 42 so that the legs 130*a* and 130*b* are passed through the opening 126 of the protuberance 124 to be received within the recess portion 134 in the inner case 22. These legs are supported by elastic abutment against the opposite wall surfaces (not shown) in the recess portion 134.

Figure 14:
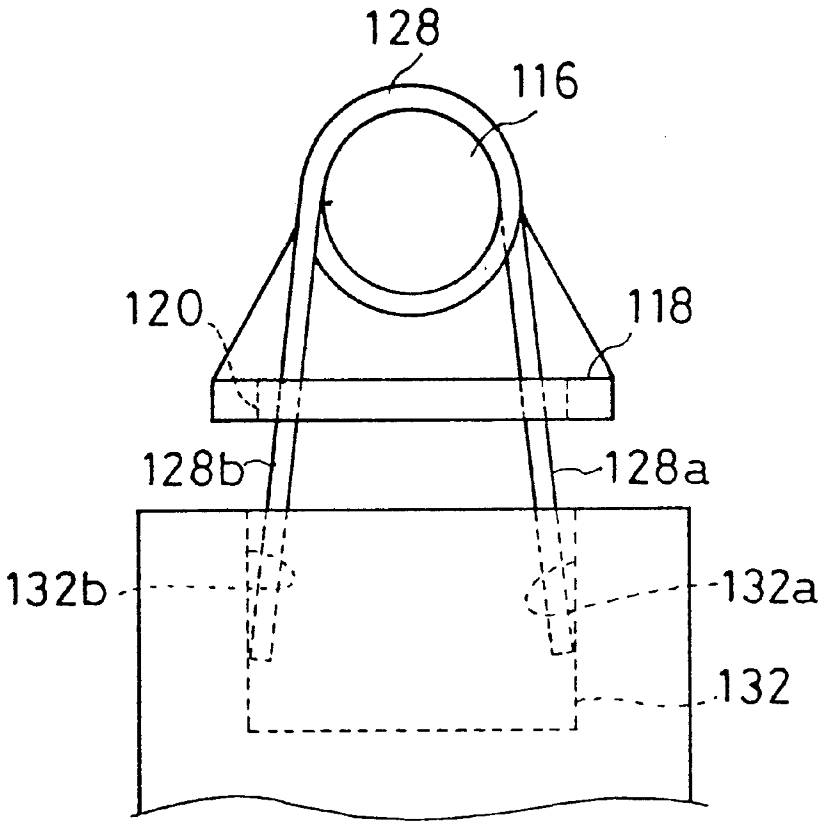
FIG. 14 is an illustrative view showing an essential part in a neutral state of the lever in FIG. 13 embodiment.

In this embodiment, when the lever 64 is not moved in any direction from the neutral state, the pair of leg portions 128*a* and 128*b* of the torsion coil spring 128 are passed through the opening 120 with gap space slightly left in the opening 120 of the protuberance 118 of the rocking member 40, as shown in FIG. 14. Accordingly, the force of the spring is not acted upon the protuberance 118.

Figure 15:
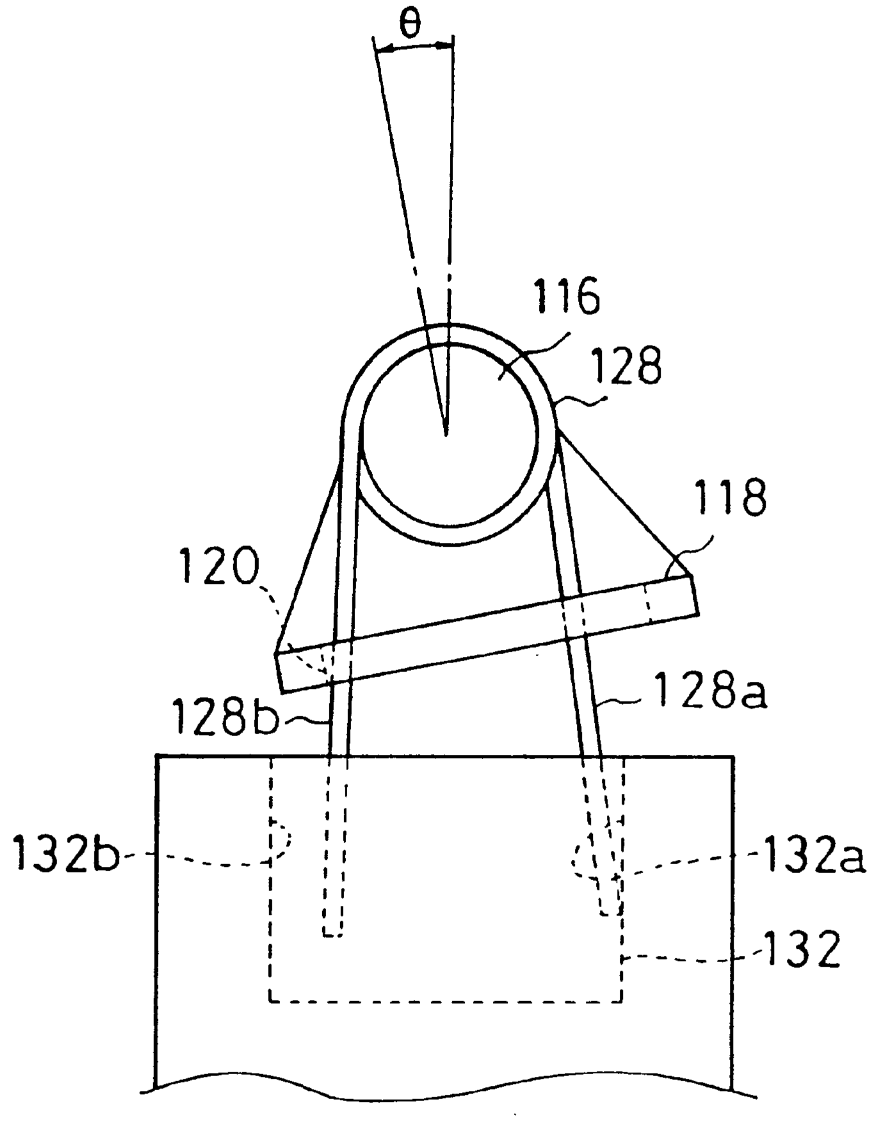
FIG. 15 is an illustrative view showing the essential part of FIG. 13 embodiment when the lever is in tilting.
Figure 16:
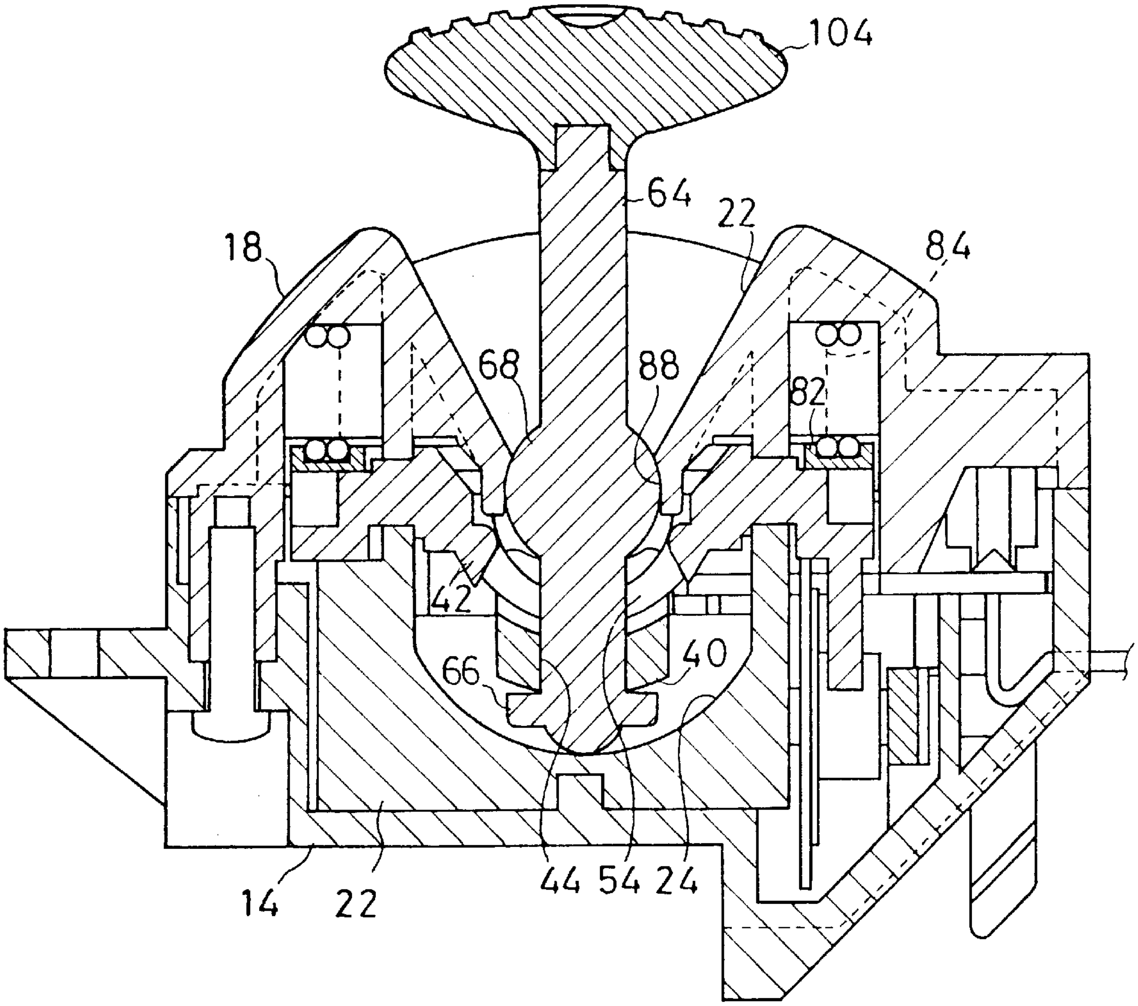
FIG. 16 is a sectional view showing another embodiment having a projection in the lever that is latched to the lower rocking member for prevention against removal off.

When the lever 64 is inclined to thereby move the rocking member 40 by an angle θ as shown in FIG. 15 about the support shaft 116, the protuberance 118 is inclined together with the rocking member 40 as shown in FIG. 15 so that one leg 128*b* is urged against the force of the torsion coil spring 128 by an edge of the opening 120 of the protuberance 118. Accordingly, when the lever 64 is released from the finger, the force of the torsion coil spring 128 is transmitted to the rocking member 40 via the leg portion 128*b*. Consequently, as the rocking member 40 is returned, the lever 64 is returned to the neutral state. This is true for the case where the lever 64 is moved in a reverse direction and then released from the fingers. Furthermore, where the lever 64 is moved in such a direction that the other rocking member 42 is moved and then the lever 64 is released from the fingers, the torsion coil spring 130 behaves in the same operational manner as that of the torsion coil spring 128, thereby returning the lever 64 to the neutral state.

In the above embodiment, the projection 66 of the lever 64 is fitted in the elongate hole 44 in the lower rocking member 40 as shown in FIG. 7 and FIG. 8. Consequently, when the lever 64 is pulled upward, the projection 66 is brought into engagement with the upper rocking member 42 thereby preventing the lever 64 from being removed off. However, it is also possible to prevent the lever 64 from being removed off by latching the projection of the lever 64 to the lower rocking member 40.

Figure 17:
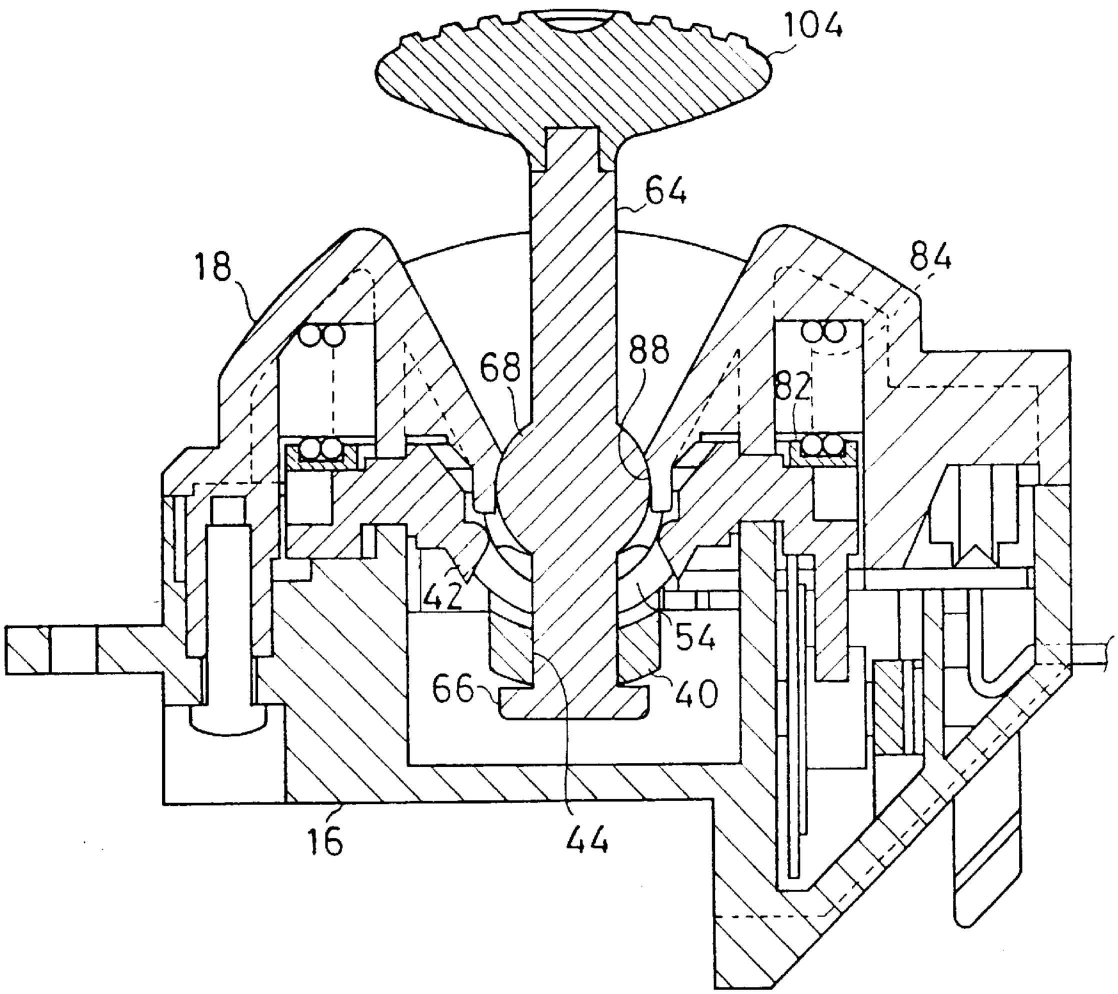
FIG. 17 is a sectional view showing an embodiment having a case formed by a singular member.

FIG. 17 shows an embodiment having a case 16 formed by a single member, wherein one pair of the rocking members at their support shafts are supported for rocking movement within the case 16. Incidentally, there appear in FIG. 17 no portions for supporting the support shafts of the rocking member 40, but in this respect this embodiment is similar to the aforestated embodiment.

In the above embodiment, the disks 34 and 36 were used as displacing members coupled to the rocking members. However, the displacing members may be of a member that is coupled to the rocking member to be linearly displaced by rocking movement of the rocking member.

Also, in the above embodiment, the slits formed in the displacing member were detected by the photointerrupter so as to output electrical signals. However, the detected portions may be formed by magnet pieces placed at a given interval in a displacing direction of the displacing member, instead of the slits. In such a case, magnetically-sensitive elements such as Hall elements can be utilized as detecting elements in place of the photointerrupters. In such a case, however, an electric signal commensurate with the tilt state of the lever is available with accuracy by using 2-channel 2-phase detecting elements in a manner similar to the above embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A joystick device, comprising:

an operating member to be tilt-operated by a hand;

an initial-position returning mechanism arranged to be automatically returned to an initial-position thereof when said operating member is released from an external force;

a first interacting member arranged for interacting solely with movement in a first direction of said operating member, and having an elongate hole;

a second interacting member arranged for interacting solely with movement in a second direction perpendicular to said first direction of said operating member, and having a second elongate hole extending in a direction perpendicular to a direction that said first elongate hole extends; and an engaging projection integrally formed in the vicinity of a lower end of said operating member to project to a length greater than a width of said first elongate hole or said second elongate hole, said operating member being prevented from being upwardly pulled off by one of said first interacting member and said second interacting member by means of said engaging projection.

2. A joystick device according to claim 1, wherein said second interacting member exists below said first interacting member, and said engaging projection has a thickness approximately equal to a length of said second interacting member and is projected to a length greater than a width of said first elongate hole, said engaging projection being slidable inside said second elongate hole and engaged with a bottom surface of said first interacting member to thereby prevent said operating member from being upwardly pulled off.

3. A joystick device according to claim 1, wherein said second interacting member exists below said first interacting member, and said engaging projection has a thickness approximately equal to a length of said second interacting member and is projected to a length greater than a width of said first elongate hole, said engaging projection being engaged with a bottom surface of said first interacting member to thereby prevent said operating member from being upwardly pulled off.

* * * * *